United States Patent
Hu et al.

(12)

(10) Patent No.: US 9,087,542 B1
(45) Date of Patent: Jul. 21, 2015

(54) METHOD FOR PROVIDING A STRUCTURE HAVING REDUCED VOIDS IN A MAGNETIC RECORDING TRANSDUCER

(71) Applicant: Western Digital (Fremont), LLC, Fremont, CA (US)

(72) Inventors: Yufeng Hu, Fremont, CA (US); Ut Tran, San Jose, CA (US); Shawn M. Tanner, San Jose, CA (US); Jerome S. Marcelino, Mountain View, CA (US); Jikou Zhou, Pleasanton, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/710,199

(22) Filed: Dec. 10, 2012

(51) Int. Cl.
| | |
|---|---|
| *H01L 21/311* | (2006.01) |
| *G11B 5/84* | (2006.01) |
| *H01L 21/316* | (2006.01) |
| *H01L 21/3105* | (2006.01) |
| *G11B 5/31* | (2006.01) |
| *G02B 6/136* | (2006.01) |
| *H01L 21/02* | (2006.01) |
| *G02B 6/132* | (2006.01) |
| *H01L 21/762* | (2006.01) |

(52) U.S. Cl.
CPC *G11B 5/84* (2013.01); *G02B 6/132* (2013.01); *G02B 6/136* (2013.01); *G11B 5/3163* (2013.01); *H01L 21/02164* (2013.01); *H01L 21/31053* (2013.01); *H01L 21/31608* (2013.01); *H01L 21/76224* (2013.01)

(58) Field of Classification Search
CPC .......... H01L 21/76224; H01L 21/02164; H01L 21/2855; H01L 21/3145; H01L 21/76837; H01L 21/76877; H01L 21/31053; H01L 21/31116; H01L 21/31608; G02B 6/132; G02B 6/136; G02B 2006/12176; G11B 5/3163

See application file for complete search history.

(56) References Cited

U.S. PATENT DOCUMENTS

| | | | |
|---|---|---|---|
| 6,044,192 A | 3/2000 | Grant et al. | |
| 6,436,790 B2 | 8/2002 | Ito | |
| 6,458,603 B1 | 10/2002 | Kersch et al. | |
| 6,605,228 B1 | 8/2003 | Kawaguchi et al. | |
| 6,780,731 B1 | 8/2004 | Tu et al. | |
| 6,872,633 B2 | 3/2005 | Huang et al. | |
| 6,908,862 B2 | 6/2005 | Li et al. | |
| 7,052,552 B2 | 5/2006 | Kwan et al. | |
| 7,256,121 B2 | 8/2007 | Yue et al. | |
| 7,294,574 B2 | 11/2007 | Ding et al. | |
| 7,343,071 B2 | 3/2008 | Laurent-Lund | |
| 7,425,494 B2 | 9/2008 | Park | |
| 7,514,348 B2 | 4/2009 | Shue et al. | |
| 7,523,550 B2 | 4/2009 | Baer et al. | |

(Continued)

*Primary Examiner* — Lan Vinh
*Assistant Examiner* — Jiong-Ping Lu

(57) ABSTRACT

A method for fabricating a structure in a magnetic recording transducer is described. A trench having sidewalls converging in a corner and a depth is formed. A dielectric layer is deposited using physical vapor deposit (PVD). The dielectric layer thickness is not more than one-half of the trench depth. A remaining portion of the trench is unfilled by the dielectric layer and has a top and a bottom. A portion of the dielectric layer is plasma etched. The plasma etch removes the portion of the dielectric layer at the top of the trench at a first rate and removes the portion of the dielectric layer at the bottom of the remaining portion of the trench at a second rate less than the first rate. An additional dielectric layer is deposited, also using PVD. The plasma etch and additional dielectric layer depositing steps are optionally repeated until the trench is filled.

23 Claims, 11 Drawing Sheets

Top View

(56) References Cited

U.S. PATENT DOCUMENTS

| | | |
|---|---|---|
| 7,951,683 B1 | 5/2011 | Shanker |
| 7,956,411 B2 | 6/2011 | Murphy et al. |
| 7,964,504 B1 | 6/2011 | Shaviv et al. |
| 7,981,763 B1 | 7/2011 | van Schravendijk et al. |
| 8,026,176 B2 | 9/2011 | Sakuma et al. |
| 8,110,085 B2 | 2/2012 | Hsiao et al. |
| 8,248,728 B2 | 8/2012 | Yamaguchi et al. |
| 8,289,649 B2 | 10/2012 | Sasaki et al. |
| 8,555,486 B1 | 10/2013 | Medina et al. |
| 2003/0033834 A1 | 2/2003 | Bazylenko |
| 2003/0033975 A1* | 2/2003 | Bazylenko .............. 117/84 |
| 2003/0127319 A1* | 7/2003 | Demaray et al. ......... 204/192.26 |
| 2003/0157812 A1 | 8/2003 | Narwankar et al. |
| 2003/0162363 A1 | 8/2003 | Ji |
| 2006/0292894 A1* | 12/2006 | Vellaikal et al. .............. 438/787 |
| 2010/0163422 A1 | 7/2010 | Hsiao et al. |

* cited by examiner

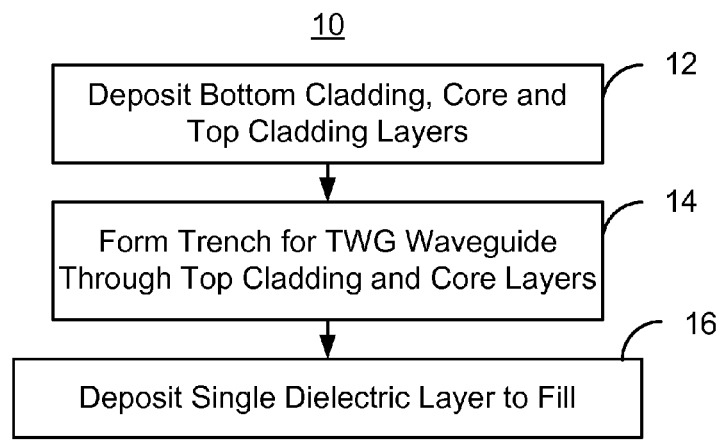
Prior Art
FIG. 1
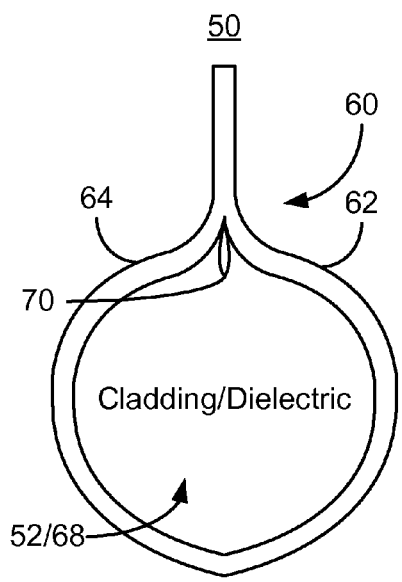
Prior Art
FIG. 2
Prior Art
FIG. 3

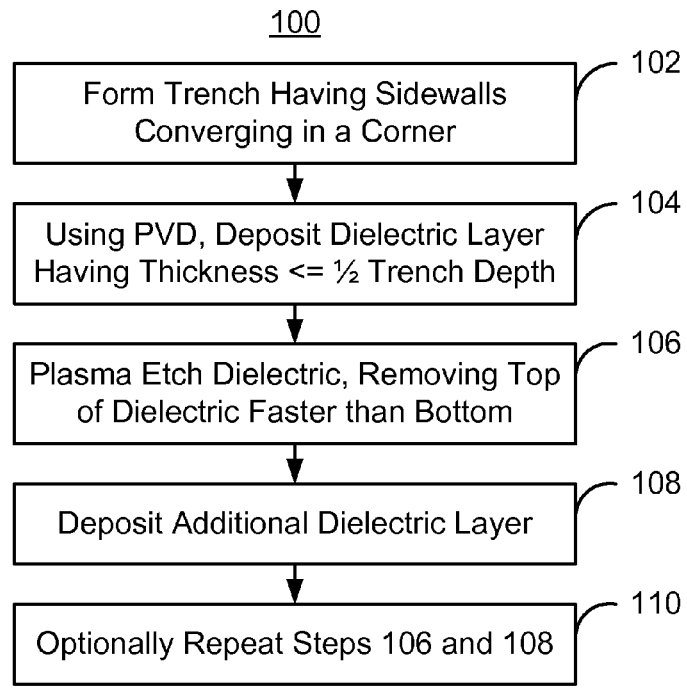
FIG. 4
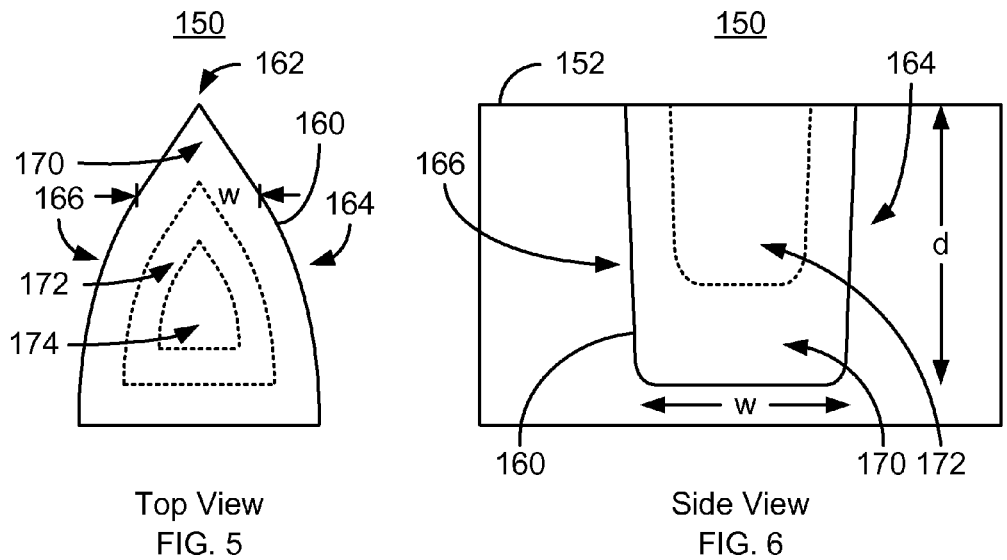
Top View
FIG. 5
Side View
FIG. 6

METHOD FOR PROVIDING A STRUCTURE HAVING REDUCED VOIDS IN A MAGNETIC RECORDING TRANSDUCER

BACKGROUND

Conventional magnetic recording heads can be fabricated in a number of ways. FIG. 1 is a flow chart depicting a conventional method 10 for fabricating an interferometric tapered waveguide (I-TWG) in an energy assisted magnetic recording (EAMR) transducer using a conventional process. An I-TWG waveguide includes a y-splitter or a multimode interferometric (MMI) device which splits the waveguide into two arms. A path difference may be introduced between the two arms. The I-TWG may be used to provide energy having the desired phase difference to a near-field transducer (NFT). The method 10 may thus be used to provide fabricate I-TWG that provides laser energy to the NFT of an EAMR transducer. For simplicity, some steps are omitted in the method 10.

The bottom cladding, core, and top cladding layers are deposited, via step 12. The bottom and top cladding are typically formed of silicon dioxide. The core is typically formed of $Ta_2O_5$. A trench is formed in the top cladding and core layers, via step 14. Because the core layer is overetched, the trench is typically also formed into a portion of the bottom cladding layer. The trench removes the core and top cladding layers between the arms of the waveguide. Thus, the arms of the I-TWB waveguide are defined in step 14.

A single conventional dielectric layer is deposited to fill the trench, via step 16. For example, the dielectric layer deposited may be two hundred fifty nanometers or more thick. The dielectric layer is typically silicon dioxide. Fabrication of the conventional EAMR transducer may then be completed.

FIGS. 2-3 depict plan and side views, respectively, of the conventional EAMR transducer 50. The EAMR transducer includes a waveguide 60. The conventional waveguide is a conventional I-TWG 60. The conventional I-TWG 60 includes a bottom cladding layer 61, arms 62 and 64 formed from the core layer and a top cladding layer 66. In forming the I-TWG 60, a trench 52 is formed in the top cladding and core layers, which is refilled with a dielectric 68. The top cladding 66, dielectric 68 and bottom cladding 61 layers may be formed of the same material. Thus, the boundaries between the layers 61, 66 and 28 are denoted by dashed lines.

Although the conventional method 10 can be used to form the conventional I-TWG 60, there are drawbacks. Some portions of the trench 52 are close to the split between the arms 62 and 64. In this region, refilling of the trench 52 through the deposition of the dielectric layer 68 in step 16 may result in voids 70. The void 70 is an empty space surrounded by the dielectric layer 68. The geometry of the void 70 may be difficult to control. The presence of the void 70 may alter the optical properties of the conventional I-TWG 60. For example, the phase difference between light traversing the arm 62 and the arm 64 may be changed. Further, there may be additional losses due to scattering of light from the void 70. Thus, performance and efficiency of the conventional I-TWG 60 may be adversely affected.

Accordingly, what is needed is an improved method for fabricating an I-TWG waveguide in an EAMR transducer.

SUMMARY

A method for fabricating a structure in a magnetic recording transducer is described. A trench having a plurality of sidewalls converging in a corner and a depth is formed. A dielectric layer is deposited using physical vapor deposit (PVD). The dielectric layer thickness is not more than one-half of the depth of the trench. A remaining portion of the trench is unfilled by the dielectric layer and has a top and a bottom. A portion of the dielectric layer is plasma etched. The plasma etch removes the portion of the dielectric layer at the top of the trench at a first rate and removes the portion of the dielectric layer at the bottom of the remaining portion of the trench at a second rate less than the first rate. An additional dielectric layer is deposited, also using PVD. The plasma etch and additional dielectric layer depositing steps are optionally repeated until the trench is filled.

BRIEF DESCRIPTION OF SEVERAL VIEWS OF THE DRAWINGS

FIG. 1 is a flow chart depicting a conventional method for fabricating a side shield.

FIGS. 2-3 are diagrams depicting plan and side views of a conventional waveguide in a conventional magnetic transducer.

FIG. 4 is a flow chart depicting an exemplary embodiment of a method for fabricating a structure for a magnetic recording transducer.

FIGS. 5-6 are diagrams depicting plan and side view an exemplary embodiment of a structure in a magnetic recording transducer.

DETAILED DESCRIPTION OF THE PREFERRED EMBODIMENTS

Figure 7:
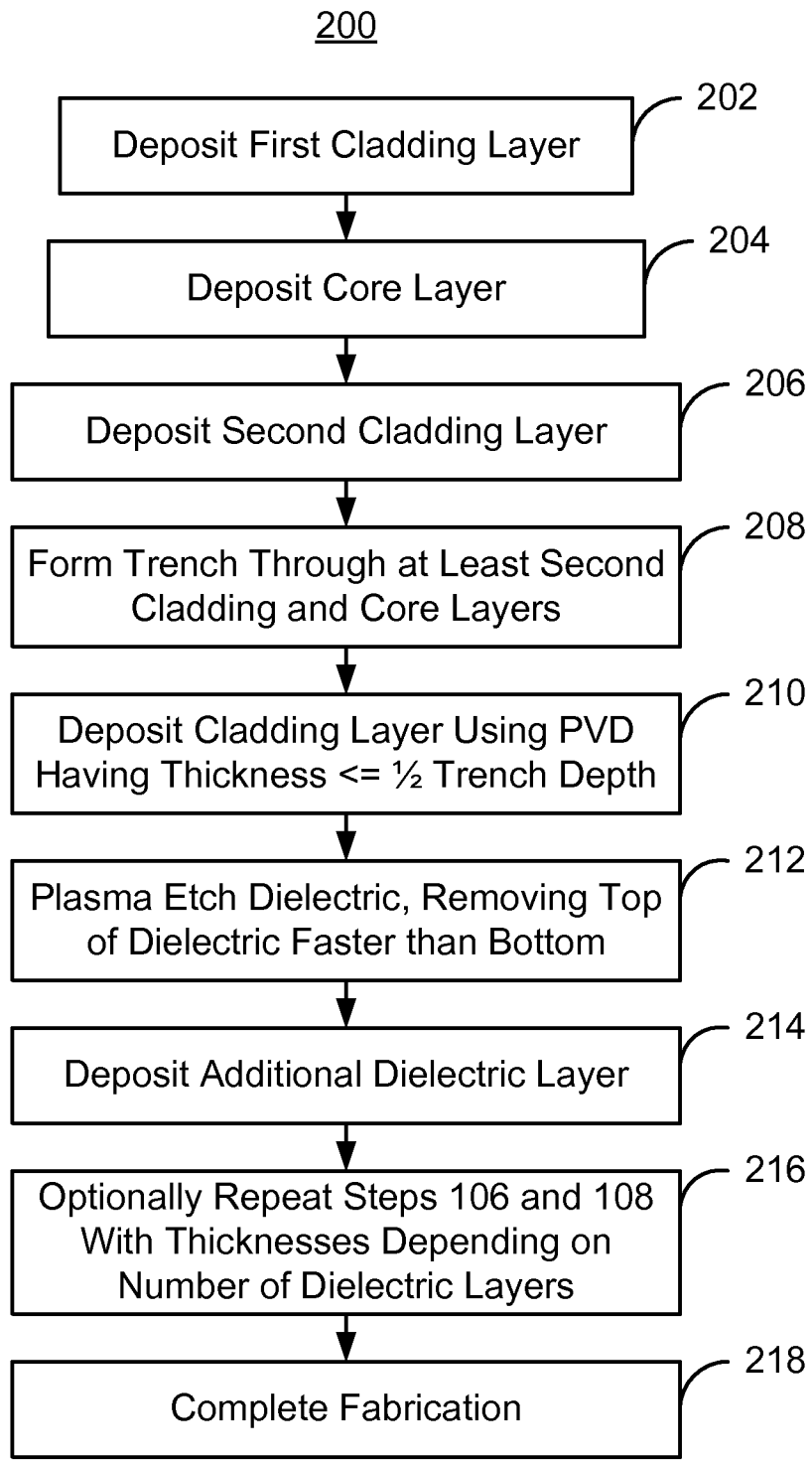
FIG. 7 is a flow chart depicting another exemplary embodiment of a method for fabricating a waveguide in magnetic recording transducer.

FIG. 4 is a flow chart depicting an exemplary embodiment of a method 100 for fabricating a structure in a transducer. The method 100 may be used in fabricating structures in transducers such as energy assisted magnetic recording (EAMR) transducers. For example, the method 100 may be used in fabricating an interferometric waveguide such as an I-TWG. However, other structures in EAMR transducers and/or other transducers may be so fabricated. For simplicity, some steps may be omitted, performed in another order, and/or combined. The magnetic recording transducer being fabricated may be part of a merged head that also includes a read head (not shown) and resides on a slider (not shown) in a disk drive. The method 100 is described in the context of forming a single transducer. However, the method 100 may be used to fabricate multiple transducers at substantially the same time. The method 100 and system are also described in the context of particular layers. However, in some embodiments, such layers may include multiple sub-layers.

The method 100 also may commence after formation of other portions of the magnetic recording transducer. For example, the method 100 may start after portions of the pole, a read transducer (if any) and/or other structures have been fabricated. The method 100 starts after the layer(s) in which trench, described below, is formed. For example, the method 100 may start after one or more dielectric layers are fabricated.

One or more trenches are formed in existing layer(s), via step 102. Each of the trenches has sidewalls that converge in a corner. Stated differently, the sidewalls converge at an acute angle to the corner. The trench also has a depth. In some embodiments, the trench is at least two hundred and fifty nanometers deep. However, in other embodiments, the depth of the trench may vary for example based upon the function of the structure being fabricated. Because the walls of the trench converge, some portion of the trench will have an aspect ratio (trench depth divided by trench width) of greater than one.

A dielectric layer is deposited using physical vapor deposition (PVD), such as sputtering, via step 104. The dielectric layer has a thickness of not more than one-half of the depth. In some embodiments, the thickness dielectric layer is at least ten percent of the depth of the trench. For example, the dielectric layer thickness may be at least fifteen and not more than twenty-five percent of the depth. In other embodiments, the thickness of the dielectric layer is at least thirty percent of the trench depth. However, the dielectric layer deposited in step 104 does not fill the trench. A remaining portion of the trench is unfilled by the dielectric layer and has a top and a bottom. Because of the nature of PVD, the top of the unfilled portion of the trench is narrower than the bottom of the remaining unfilled part of the trench. Thus, if filling continued, the top may close before the trench is filled, resulting in voids. Consequently, step 104 preferably terminates before a void is formed in the trench.

A portion of the dielectric layer is plasma etched using the appropriate chemistry for the dielectric, via step 106. The plasma etching removes the dielectric layer at the top of the trench more quickly than the plasma etch removes the dielectric layer at the bottom of the open portion of the trench. Thus, step 106 changes the profile of the unfilled portion of the trench so that the top is at least as wide as the bottom of the unfilled portion of the trench. In some embodiments, at least thirty and not more than seventy percent of the thickness of the layer is removed in step 106. In some such embodiments, at least forty and not more than sixty percent of the thickness of the layer may be removed in step 106.

An additional dielectric layer is deposited using PVD, via step 108. In some embodiments, the additional dielectric layer deposited in step 108 fills the trench such that no voids are formed. In other embodiments, the dielectric layer deposited in step 108 may not so fill the trench. In such a case, the plasma etching and depositing steps 106 and 108 are repeated until the trench is filled, via step 110.

In embodiments in which steps 106 and 108 are repeated, the amount of the dielectric layer removed during each repetition of step 106 and the thickness of the additional dielectric layer(s) deposited in each repetition of step 108 depends upon how many dielectric layers have been deposited and, therefore, how much of the trench remains unfilled. For example, at least thirty and not more than seventy percent of the thickness of the last dielectric layer deposited is removed in a repetition of step 106 if not more than two dielectric layers have been deposited in the trench. In contrast, not more than thirty percent of the thickness of the last dielectric layer deposited may be removed in a repetition of step 106 if at least than two dielectric layers have been deposited in the trench. In some such embodiments, at least fifteen and not more than twenty-five percent of the thickness of the last dielectric layer deposited may be removed if at least two dielectric layers have been deposited. Similarly, the dielectric layer deposited in a repetition of step 108 may have a thickness of not more than fifty percent of the depth of the trench depth if less than two layers have been deposited. The dielectric layer deposited in a repetition of step 108 may have a thickness of at least thirty and not more than sixty percent of the depth if at least two dielectric layers have been deposited in the trench. In some such embodiments, the thickness of the dielectric layer deposited may be at least thirty-five and not more than forty-five percent of the depth if at least two dielectric layers have been deposited in the trench in a repetition of step 108. In some embodiments, steps 102, 104, 106, 108 and 110 are performed in a single chamber. Thus, the PVD deposition and plasma etches may be performed without breaking vacuum. In such embodiments, the removals performed in step(s) 106 and 110 may be analogous to a sputter etch. However, the steps may be performed in another manner. Further, the depositions in steps 104, 108 and 110 and the removal in steps 106 and 110 may be performed using the same or different gases. The gases used generally depend upon the material(s) being deposited and etched.

FIGS. 5-6 are diagrams depicting top and side views an exemplary embodiment of a portion of a magnetic transducer 150 having a structure formed using the method 100. For clarity, FIGS. 5-6 are not to scale. The magnetic transducer 150 may be part of a merged head that includes at least one read transducer (not shown) in addition to one or more magnetic transducer(s) 150. The magnetic transducer 150 includes a trench 160 that has been formed in one or more layers 152 as part of formation of a structure in the magnetic transducer 150. In some embodiments, the trench 160 may separate and/or define portions of the structure being formed. In other embodiments, the trench 160 may be part of the structure being formed. The trench 160 has a corner 162 to which the sidewalls 164 and 166 converge. The sidewalls 164 and 166 converge to corner 162 at an acute angle. In other embodiments, the sidewalls 164 and 166 may converge in another manner and at another angle. However, the corner 162 is still an acute angle. As can be seen in FIGS. 5 and 6, a portion of the trench 160 has a depth, d, and a width, w. Because the depth is greater than the width, the aspect ratio (d/w) is greater than one. To fill the trench, three dielectric layers 170, 172 and 174 have been used. However, in the portion of the trench 160 shown in FIG. 6, only two layers, 170 and 172, are present. In the embodiment shown, the dielectric layers 170, 172 and 174 are the same material. Thus, the layers 170, 172 and 174 are shown as separated by dotted lines.

Using the method 100, the trench 160 has been filled. Because the dielectric layers are alternately deposited and partially removed, the top of the unfilled portion of the trench remains wider than the bottom for deposition of the next layer. As a result, the trench 160 may be filled without formation of voids in the layers 170, 172 and/or 174. If only a single layer were used to fill the trench 160, voids may be formed because the aspect ratio of the trench is greater than one in some regions. Thus, the performance of the structure being fabricated may be enhanced. For example, the performance of an I-TWG may be improved.

FIG. 7 is a flow chart depicting another exemplary embodiment of a method 200 for fabricating an interferometric waveguide such as an I-TWG in an EAMR transducer. For simplicity, some steps may be omitted. FIGS. 8-23 are diagrams depicting side and plan views of an exemplary embodiment of a portion of a transducer 250 during fabrication. For clarity, FIGS. 8-23 are not to scale. Referring to FIGS. 7-23, the method 200 is described in the context of the transducer 250. However, the method 200 may be used to form another device (not shown). The transducer 250 being fabricated may be part of a merged head that also includes a read head (not shown in FIGS. 8-23) and resides on a slider (not shown) in a disk drive. The method 200 also may commence after formation of other portions of the transducer 250. The method 200 is also described in the context of providing an I-TWG waveguide in a single transducer 250. However, the method 200 may be used to fabricate multiple structures and/or multiple transducers at substantially the same time. The method 200 and device 250 are also described in the context of particular layers. However, in some embodiments, such layers may include multiple sublayers.

The method 200 also commences after formation of other portions of the magnetic recording transducer. For example, the method 200 may start after the portions of the pole, the read transducer and/or other structures have been provided.

A first cladding layer is deposited, via step 202. In some embodiments, the first cladding layer is an $SiO_2$ layer and may be deposited using PVD. However, in other embodiments, additional and/or other materials including but not limited to aluminum oxide might be used. A core layer is deposited, via step 204. In some embodiments, the core layer is $Ta_2O_5$ and may be deposited using PVD. In other embodiments, however, additional or other materials may be used. A second cladding layer is deposited, via step 206. In some embodiments, the second cladding layer is an $SiO_2$ layer and may be deposited using PVD. However, other and/or additional materials may be used.

Figure 8:
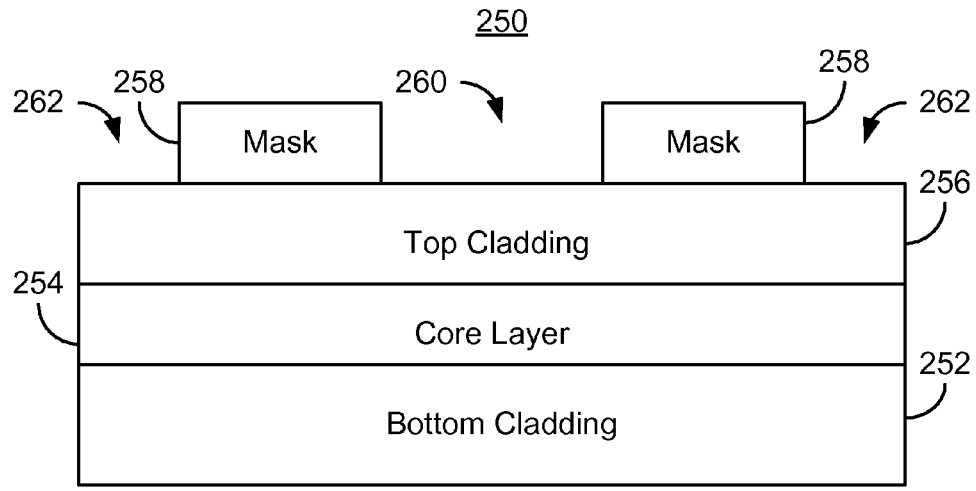
FIGS. 8-23 are diagrams depicting an exemplary embodiment of waveguide in a magnetic recording transducer during fabrication.
Figure 9:
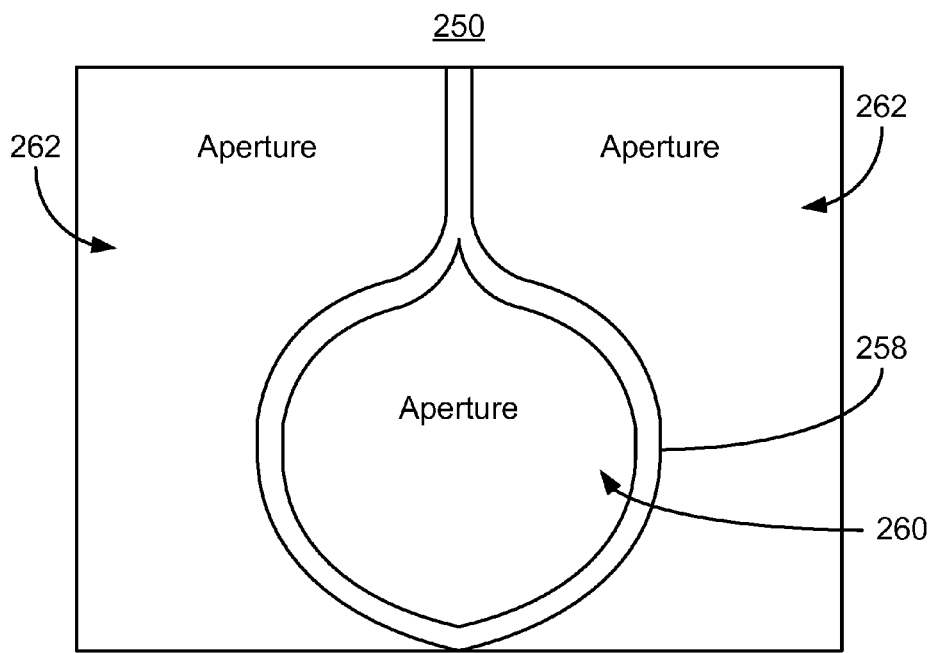
Figure 10:
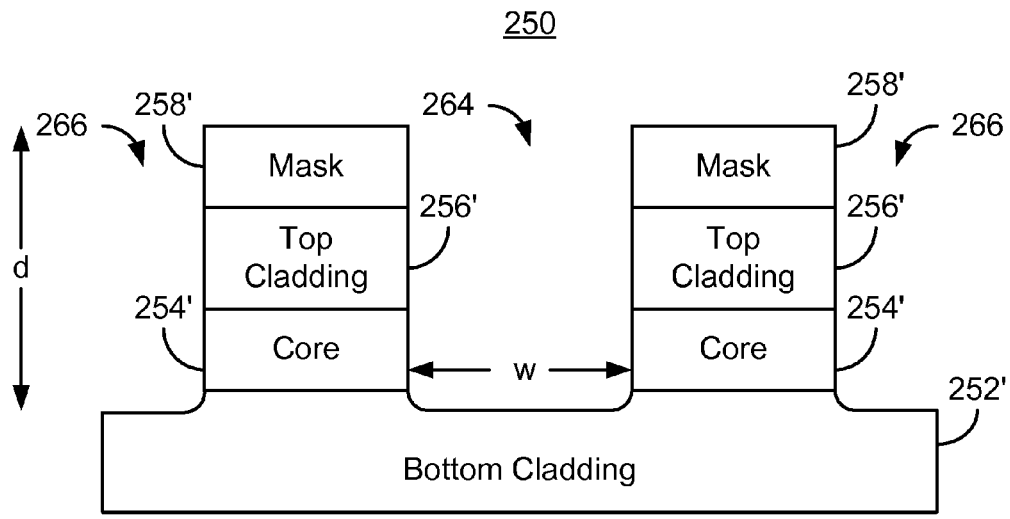
Figure 11:
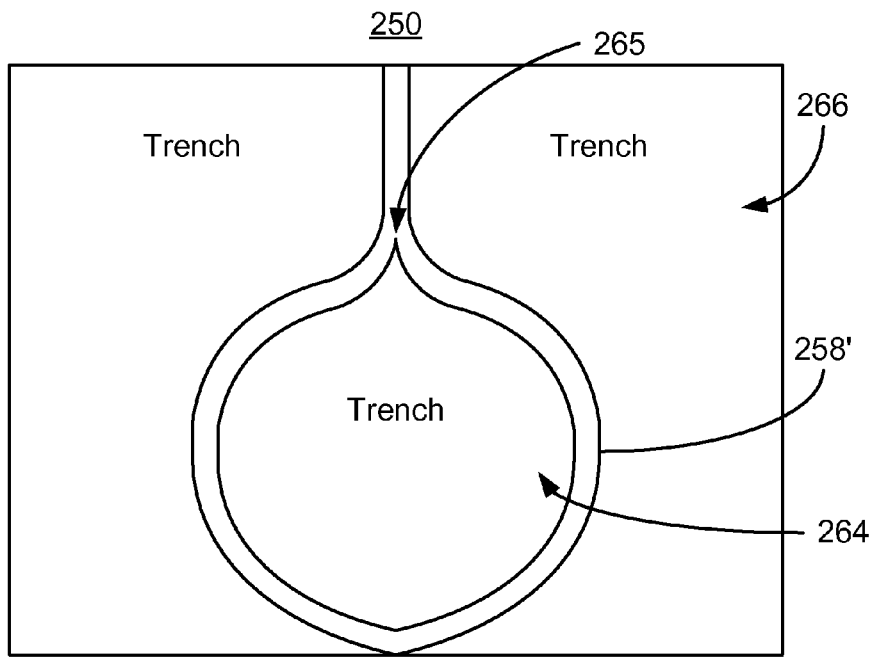

Portions of at least the core and second cladding layers are removed to form a trench therein, via step 208. In general, a portion of the first cladding layer is also removed by over-etching in order to ensure that all of the core material in the desired region is removed. FIGS. 8 and 9 depict side and top views, respectively, of the transducer 250 during step 208. Thus, bottom cladding layer 252, core layer 254 and top cladding layer 256 have been deposited. In addition, a mask 258 having apertures 260 and 262 has been formed. The mask 258 covers the portion of the layers 252, 254 and 256 that will form the waveguide. The apertures 260 and 262 correspond to portions of the layers 252, 254 and 256 that will be removed in step 208. FIGS. 10 and 11 depict side and top views, respectively, of the transducer 250 after step 208 has been performed. Trenches 264 and 266 have been formed, leaving layers 252', 254' and 256'. The core 254' under mask 258' corresponds to the two arms of the interferometric waveguide being formed. The trench 264 has sidewalls that converge in a corner 265. The corner 265 is an acute angle. In other embodiments, the sidewalls may converge in another manner and at another angle at the corner 265. However, the corner 265 is still an acute angle.

Figure 12:
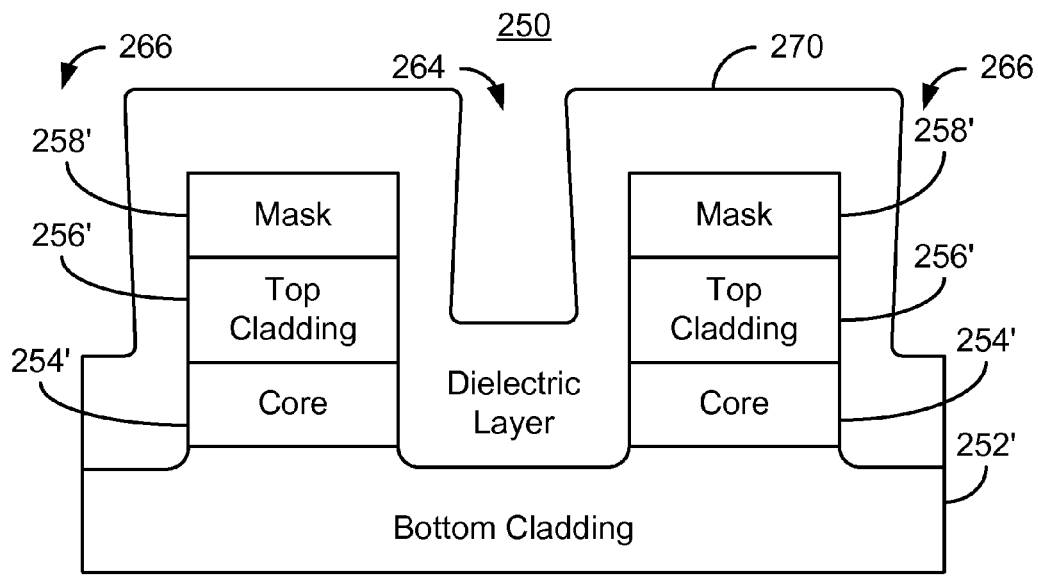
Figure 13:
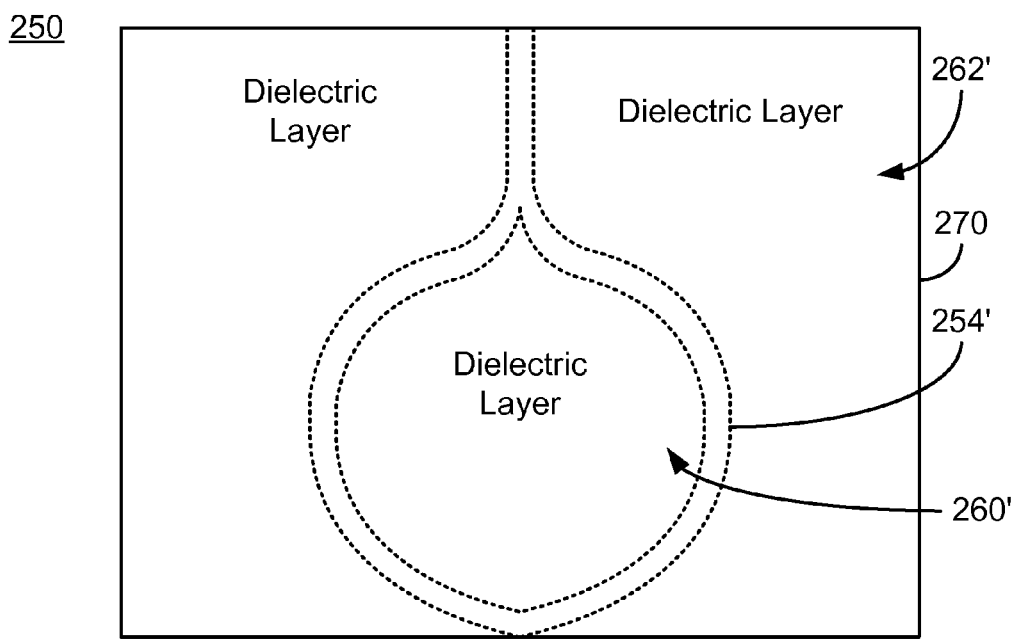

A dielectric cladding layer having a thickness that is not more than half of the trench depth, d, is deposited using PVD, via step 210. For example, $SiO_2$ may be deposited in step 210. In some embodiments, the cladding layer deposited in step 210 is formed of the same material(s) as the cladding layers 252 and/or 256. However, in other embodiments, other materials might be used. FIGS. 12 and 13 depict side and top views, respectively, of the transducer 250 after step 210 is performed. Thus, the dielectric cladding layer 270 is shown. As can be seen, the trench 264 is not filled and the top of the unfilled portion of the trench 264 is not wider than the bottom. Thus, if filling continued, the top may close before the trench 264 is filled, resulting in voids. Consequently, step 210 preferably terminates before a void is formed in the trench 264.

Figure 14:
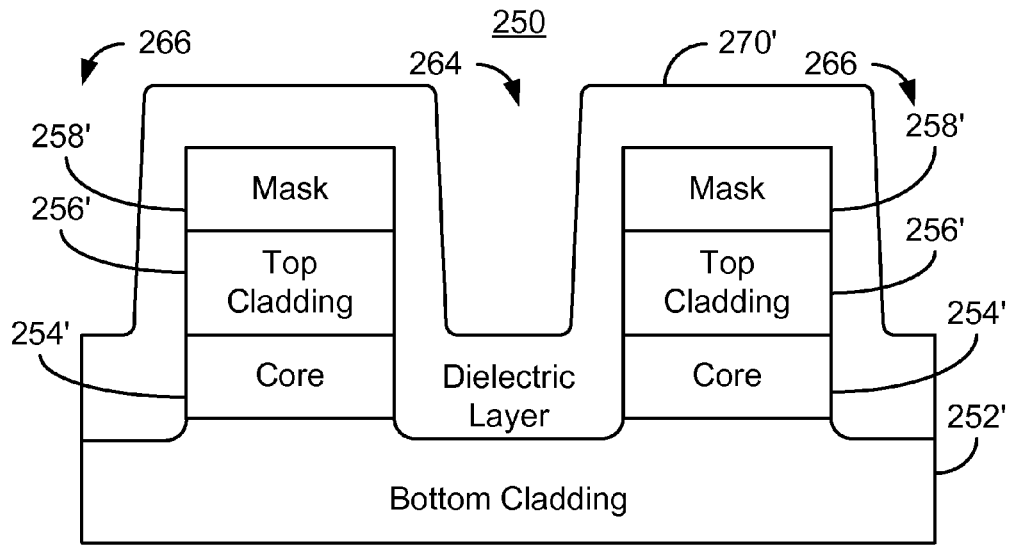
Figure 15:
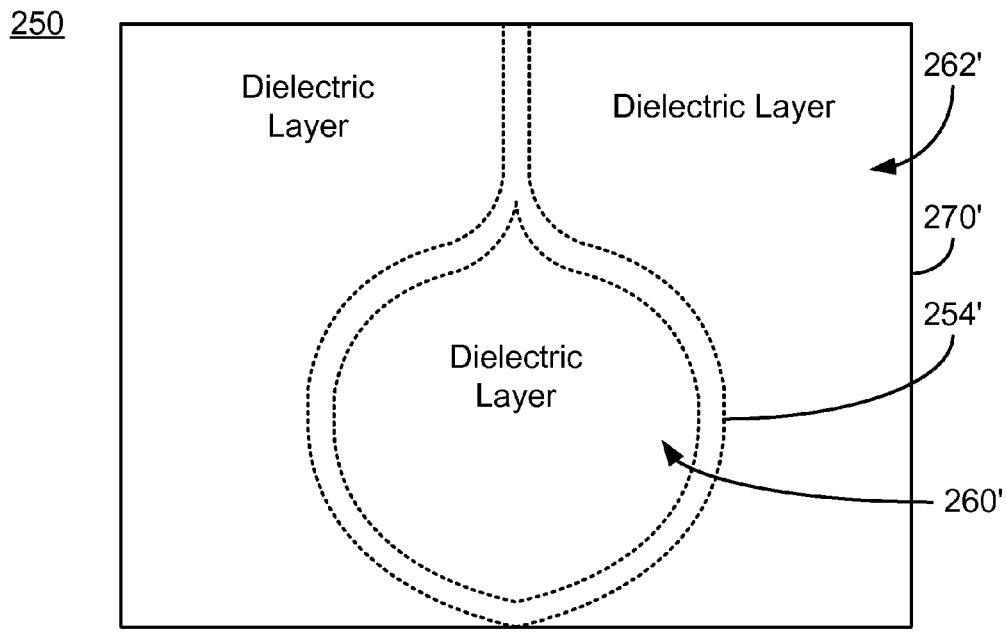

A portion of the cladding layer 270 is plasma etched using the appropriate chemistry for the dielectric, via step 212. The plasma etching removes the cladding layer 270 at the top of the trench 264 more quickly than the plasma etch removes the cladding layer 270 at the bottom of the open portion of the trench 264. In some embodiments, at least thirty and not more than seventy percent of the thickness is removed in step 212. In some such embodiments, at least forty and not more than sixty percent of the thickness may be removed in step 212. FIGS. 14 and 15 depict side and top views, respectively, of the transducer 250 after step 212 is performed. Thus, a portion of the cladding layer 270' remains. In addition, the top of the remaining unfilled portion of the trench 264 is at least as wide as the bottom.

Figure 16:
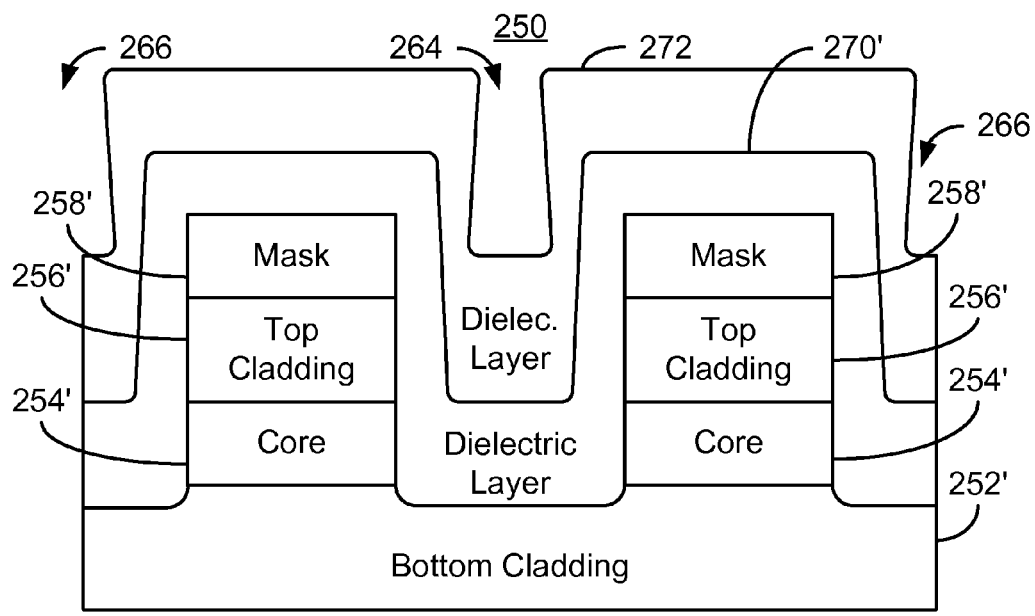
Figure 17:
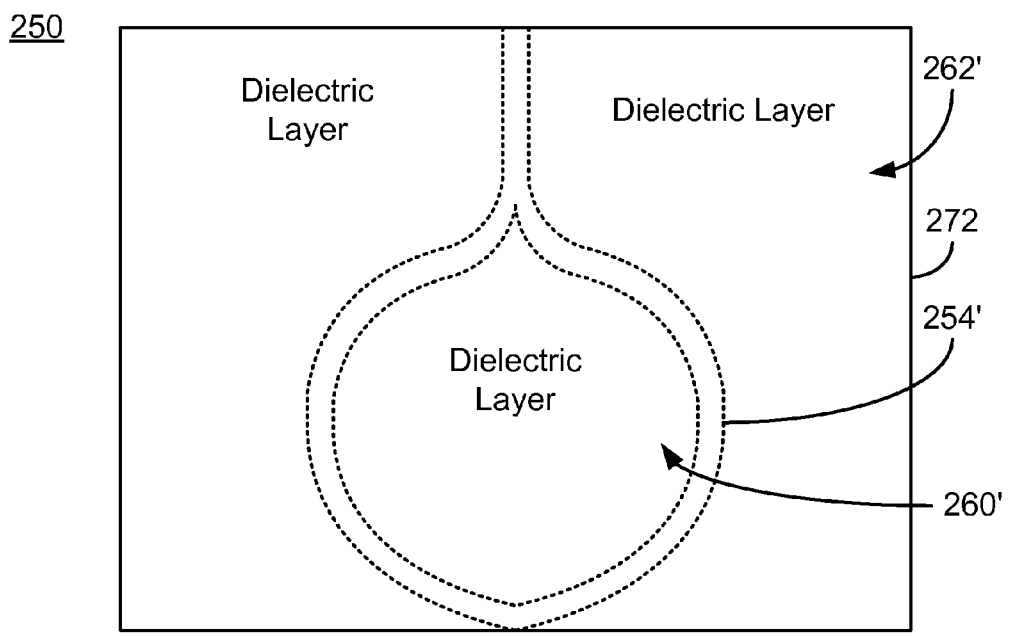

An additional cladding layer is deposited using PVD, via step 214. For example, $SiO_2$ may be deposited in step 214. In some embodiments, the cladding layer deposited in step 214 is formed of the same material(s) as the cladding layers 252 and/or 256. FIGS. 16 and 17 depict side and top views, respectively, of the transducer 250 after step 214 is performed. Thus, another dielectric cladding layer 272 is shown. In some embodiments (not shown), the additional cladding layer 272 deposited in step 214 fills the trench such that no voids are formed. In this embodiment, however, the cladding layer 272 does not so fill the trench. In such a case, the plasma etching and depositing steps 212 and 214 are repeated until the trench 264 is filled, via step 216. In embodiments in which steps 212 and 214 are repeated, the amount of the cladding layer removed during each repetition of step 212 and the thickness of the additional cladding layer(s) deposited in each repetition of step 214 depends upon how many cladding layers have been deposited and, therefore, how much of the trench remains unfilled. For example, at least thirty and not more than seventy percent of the thickness of the last cladding layer deposited is removed in a repetition of step 212 if not more than two dielectric layers have been deposited in the trench. In contrast, not more than thirty percent of the thickness of the last cladding layer deposited may be removed in a repetition of step 212 if at least two dielectric layers have been deposited in the trench. In some such embodiments, at least fifteen and not more than twenty-five percent of the thickness of the last cladding layer deposited may be removed if at least two cladding layers have been deposited. Similarly, the cladding layer deposited in a repetition of step 214 may have a thickness of not more than fifty percent of the depth of the trench depth if less than two layers have been deposited in a repetition of step 214. The cladding layer deposited in a repetition of step 214 may have a thickness of at least thirty and not more than sixty percent of the depth if at least two cladding layers have been deposited in the trench. In some such embodiments, the thickness of the cladding layer deposited may be at least thirty-five and not more than forty-five percent of the depth if at least two cladding layers have been deposited in the trench in a repetition of step 218. In some embodiments, steps 212, 214, 216, and 110 are performed in a single chamber. Thus, the PVD deposition and plasma etches may be performed without breaking vacuum. In such embodiments, the removals performed in step(s) 106 and 110 may be analogous to a sputter etch. However, the steps may be performed in another manner. Further, the depositions in steps 210, 214 and 216 and the removal in steps 212 and 216 may be performed using the same or different gases. The gases used generally depend upon the material(s) being deposited and etched.

Figure 18:
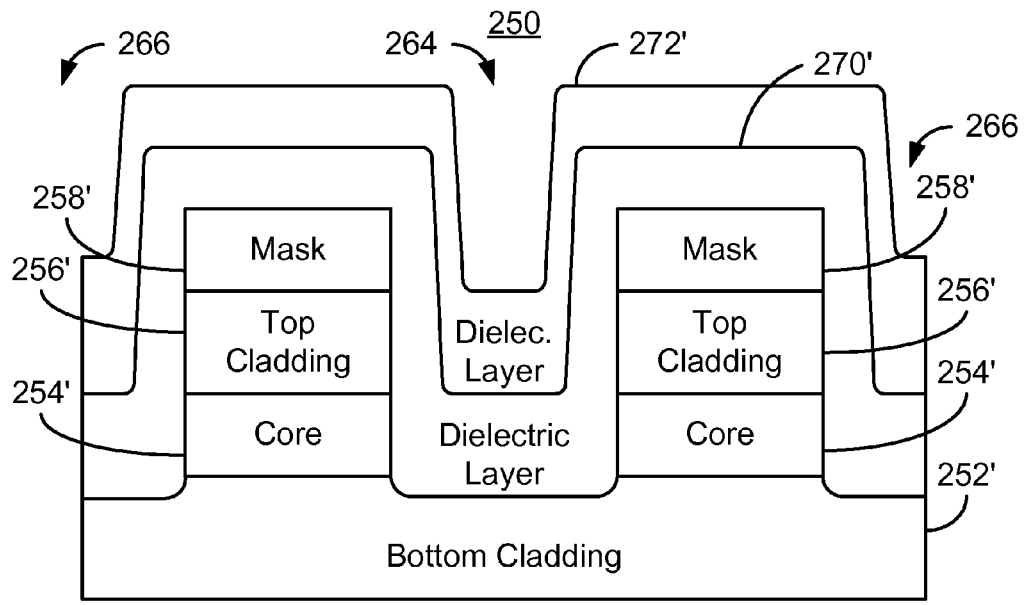
Figure 19:
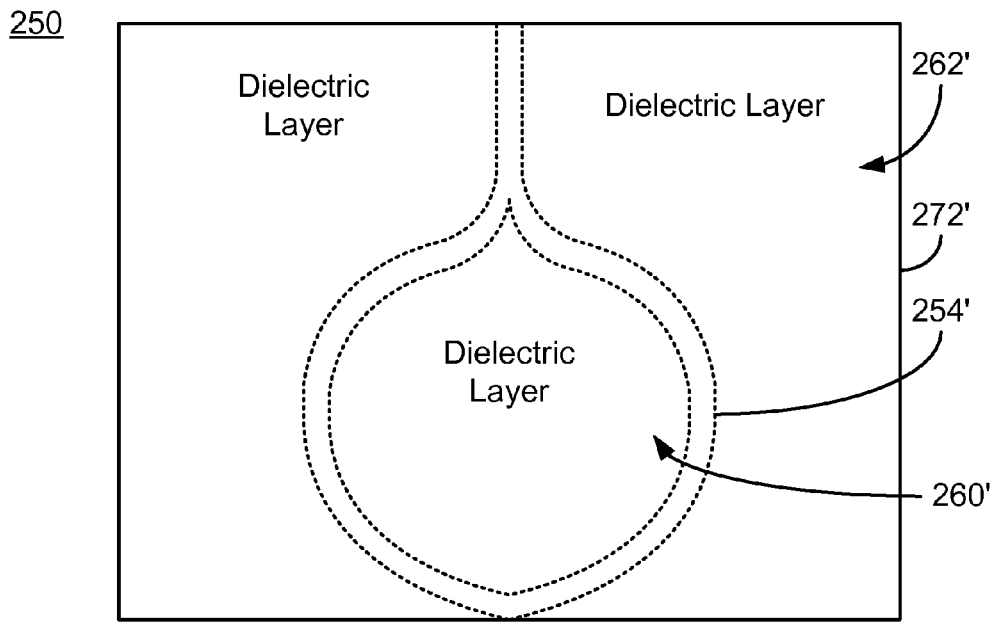
Figure 20:
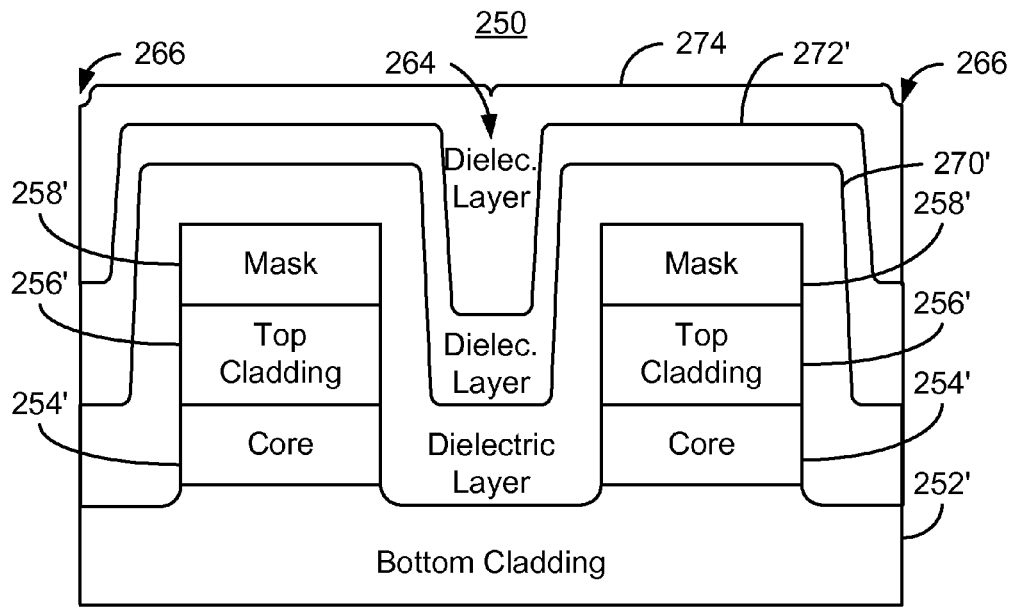
Figure 21:
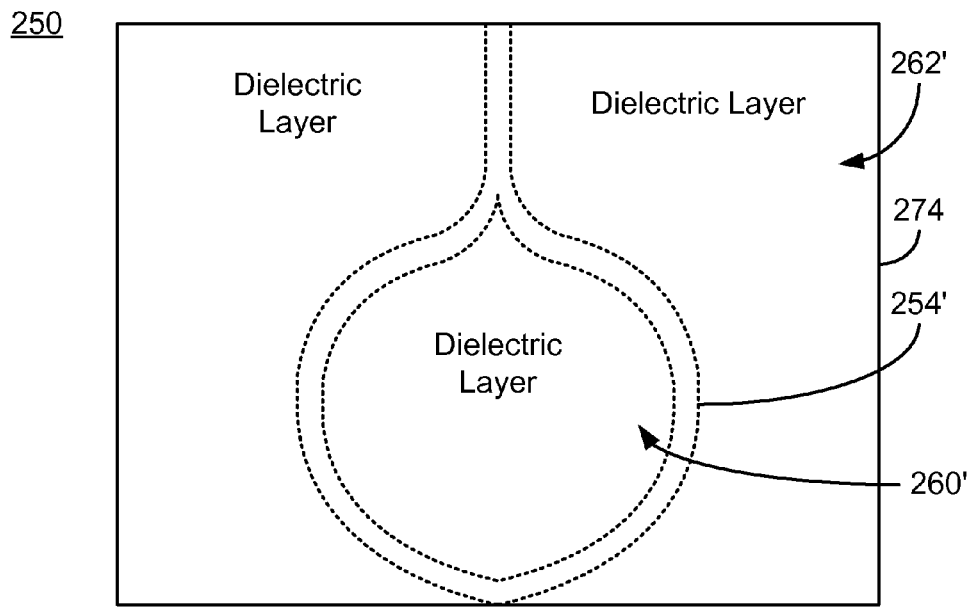
Figure 22:
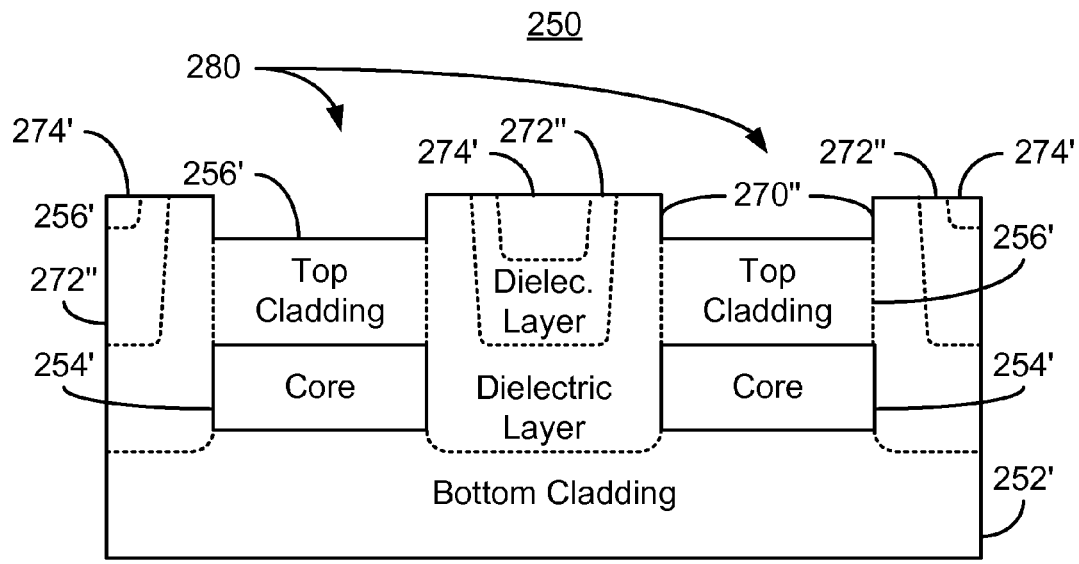
Figure 23:
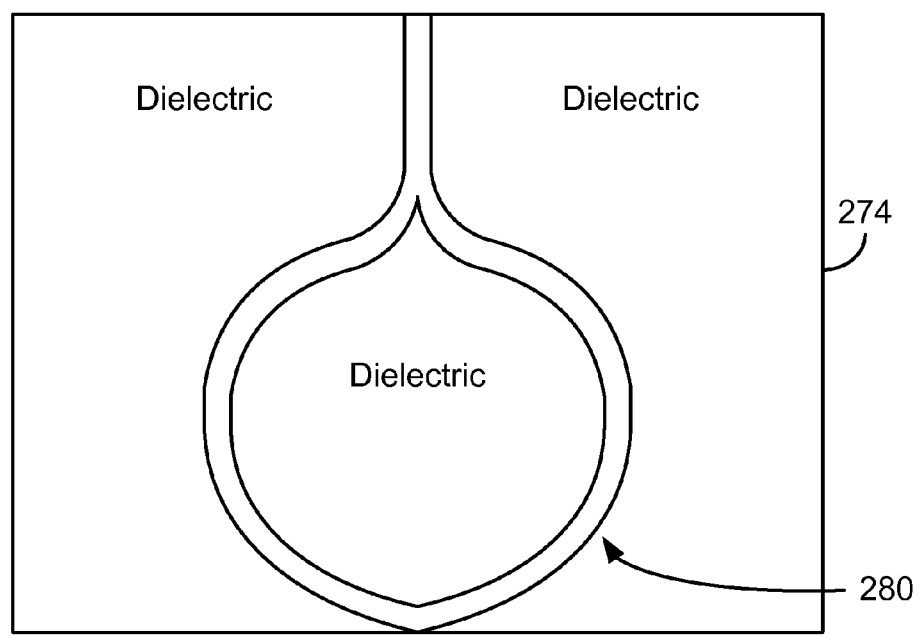

For example, FIGS. 18 and 19 depict side and top views of the transducer 250 after the second dielectric cladding layer 272' has been subjected to an etch during a first repetition of step 212, using step 216. The trench 264 is still partially open and the top is not narrower than the bottom. FIGS. 20 and 21 depict the transducer 250 after step 214 has been repeated once through step 216. Thus, another cladding layer 274 has been deposited. In this case, the trench 264 is filled. Thus, fabrication of the transducer 250 may be completed, via step 218. For example, the mask 258' may be removed and other structures may be formed. FIGS. 22-23 depict the transducer 250 after the mask 258' has been removed. Thus, a waveguide 280 having arms formed from core materials 254' has been formed. In addition, portions of the dielectric cladding layers deposited in the method 200 have been removed, leaving layers 270", 272" and 274'.

Using the method 200, the waveguide 280 has been formed and the trench 264 filled by layers 270", 272" and 274'. Because the dielectric cladding layers 270. 272 and 274 are alternately deposited and partially removed, the top of the unfilled portion of the trench 264 remains wider than the bottom for deposition of the next layer. As a result, the trench 264 may be filled without formation of voids in the layer 270", 272" or 274'. Thus, the desired phase difference and optical efficiency for the I-TWG may be obtained. For example, the performance of an I-TWG waveguide may be improved.

We claim:

1. A method for fabricating a structure in a magnetic recording transducer, the method comprising:
    forming a trench having a plurality of sidewalls, the plurality of sidewalls converging in a corner at an acute angle, the trench having a depth, a first portion of the trench having a width greater than the depth, a second portion closer to the corner than the first portion having the width less than the depth;
    depositing a dielectric layer using physical vapor deposit (PVD), the dielectric layer having a thickness of not more than one-half of the depth, a remaining portion of the trench being unfilled by the dielectric layer, the remaining portion of the trench having a top and a bottom;
    plasma etching a portion of the dielectric layer, the plasma etching removing the portion of the dielectric layer at the top of the trench at a first rate and removing the portion of the dielectric layer at the bottom of the remaining portion of the trench at a second rate less than the first rate, wherein the step of plasma etching further includes removing at least thirty and not more than seventy percent of the thickness if not more than two dielectric layers have been deposited in the trench;
    depositing an additional dielectric layer using PVD; and
    optionally repeating the plasma etching and additional dielectric layer depositing steps until the trench is filled, wherein the additional dielectric layer has an additional layer thickness and wherein the step of optionally repeating the plasma etching and additional dielectric layer depositing steps further includes removing not more than thirty percent of the additional layer thickness if at least two dielectric layers have been deposited in the trench.

2. The method of claim 1 wherein the step of depositing the dielectric layer further includes:
    depositing the dielectric layer having the thickness of at least ten percent of the depth.

3. The method of claim 2 wherein the thickness is at least thirty percent of the depth.

4. The method of claim 2 wherein the thickness is at least fifteen percent and not more than twenty-five percent of the depth.

5. The method of claim 1 wherein the step of removing the portion of the dielectric layer further includes:
    removing at least forty and not more than sixty percent of the thickness if not more than two dielectric layers have been deposited in the trench.

6. The method of claim 1 wherein the step of optionally repeating the plasma etching and additional dielectric layer depositing steps further includes:
    depositing the additional dielectric layer having an additional layer thickness of at least thirty and not more than sixty percent of the depth if at least two dielectric layers have been deposited in the trench.

7. The method of claim 6 wherein the additional layer thickness is at least thirty-five and not more than forty-five percent of the depth if at least two dielectric layers have been deposited in the trench.

8. The method of claim 1 wherein the step of optionally repeating the plasma etching and additional dielectric layer depositing steps further includes:
    removing at least fifteen and not more than twenty-five percent of the additional layer thickness if at least two dielectric layers have been deposited in the trench.

9. The method of claim 1 wherein the steps of depositing the dielectric layer, plasma etching the portion of the dielectric layer, depositing the additional dielectric layer and optionally repeating the plasma etching and additional dielectric layer depositing steps are performed in a single chamber.

10. The method of claim 1 wherein the step of depositing the dielectric layer, the step of removing the portion of the dielectric layer and the step of depositing the additional dielectric layer use a particular gas.

11. The method of claim 1 wherein the step of depositing the dielectric layer and the step depositing the additional dielectric layer use a first gas, the step of removing the portion of the dielectric layer uses a second gas different from the first gas.

12. A method for fabricating an interferometric tapered waveguide in a magnetic recording transducer, the method comprising:
    depositing a first cladding layer;
    depositing a core layer;
    depositing a second cladding layer;
    removing a portion of at least the second cladding layer and the core layer to form a trench through the second cladding layer and the core layer, the trench having a plurality of sidewalls that converge in a corner at an acute angle, the plurality of sidewalls corresponding to a plurality of arms of the interferometric tapered waveguide, the trench having a depth, a first portion of the trench having a width greater than the depth, a second portion closer to the corner than the first portion having the width less than the depth;
    depositing a dielectric cladding layer using physical vapor deposit (PVD), the dielectric cladding layer having a thickness of not more than one-half of the depth, a remaining portion of the trench being unfilled by the dielectric layer, the remaining portion of the trench having a top and a bottom;
    plasma etching a portion of the dielectric cladding layer, the plasma etching removing the portion of the dielectric cladding layer at the top of the trench at a first rate and removing the portion of the dielectric cladding layer at the bottom of the remaining portion of the trench at a second rate less than the first rate, wherein the step of plasma etching further includes removing at least thirty and not more than seventy percent of the thickness if not more than two dielectric layers have been deposited in the trench;
    depositing an additional dielectric cladding layer using PVD; and
    optionally repeating the plasma etching and additional dielectric layer depositing steps until the trench is filled, wherein the additional dielectric layer has an additional layer thickness and wherein the step of optionally repeating the plasma etching and additional dielectric layer depositing steps further includes removing not more than thirty percent of the additional layer thickness if at least two dielectric layers have been deposited in the trench.

13. The method of claim 12 wherein the step of depositing the dielectric cladding layer further includes:
    depositing the dielectric cladding layer having the thickness of at least ten percent of the depth.

14. The method of claim 13 wherein the thickness is at least thirty percent of the depth.

15. The method of claim 13 wherein the thickness is at least fifteen percent and not more than twenty-five percent of the depth.

16. The method of claim 12 wherein the step of removing the portion of the dielectric cladding layer further includes:
    removing at least forty and not more than sixty percent of the thickness if not more than two dielectric layers have been deposited in the trench.

17. The method of claim 12 wherein the step of optionally repeating the plasma etching and additional dielectric layer depositing steps further includes:
    depositing the additional dielectric cladding layer having an additional layer thickness of at least thirty and not more than sixty percent of the depth if at least two dielectric cladding layers have been deposited the trench.

18. The method of claim 17 wherein the additional layer thickness is at least thirty-five and not more than forty-five percent of the depth if at least two dielectric cladding layers have been deposited the trench.

19. The method of claim 12 wherein the step of optionally repeating the plasma etching and additional dielectric cladding layer depositing steps further includes:
    removing at least fifteen and not more than twenty-five percent of the additional layer thickness if at least two dielectric cladding layers have been deposited the trench.

20. The method of claim 12 wherein the steps of depositing the dielectric cladding layer, plasma etching the portion of the dielectric cladding layer, depositing the additional dielectric cladding layer and optionally repeating the plasma etching and additional dielectric cladding layer depositing steps are performed in a single chamber.

21. The method of claim 12 wherein the step of depositing the dielectric cladding layer, the step of removing the portion of the dielectric layer and the step of depositing the additional dielectric cladding layer use a particular gas.

22. The method of claim 12 wherein the step of depositing the dielectric cladding layer and the step depositing the additional dielectric cladding layer use a first gas, the step of removing the portion of the dielectric cladding layer uses a second gas different from the first gas.

23. A method for fabricating an interferometric tapered waveguide in a magnetic recording transducer, the method comprising:
    depositing a first cladding layer;
    depositing a core layer;
    depositing a second cladding layer;
    removing a portion of at least the second cladding layer and the core layer to form a trench through the second cladding layer and the core layer, the trench having a plurality of sidewalls, the plurality of sidewalls converging in a corner at an acute angle, the plurality of sidewalls corresponding to a plurality of arms of the interferometric tapered waveguide, the trench having a depth, a first portion of the trench having a width greater than the depth, a second portion closer to the corner than the first portion having the width less than the depth;
    depositing a dielectric cladding layer using physical vapor deposit (PVD), the dielectric cladding layer having a thickness of at least fifteen percent and not more than twenty-five percent of the depth, a remaining portion of the trench being unfilled by the dielectric layer, the remaining portion of the trench having a top and a bottom;
    plasma etching a portion of the dielectric cladding layer, the plasma etching removing the portion of the dielectric cladding layer at the top of the trench at a first rate and removing the portion of the dielectric cladding layer at the bottom of the remaining portion of the trench at a second rate less than the first rate, the plasma etching further removing at least thirty and not more than seventy percent of the thickness if not more than two dielectric layers have been deposited in the trench;
    depositing an additional dielectric cladding layer having an additional layer thickness of at least thirty and not more than sixty percent of the depth if at least two dielectric cladding layers have been deposited and having the additional layer thickness of at least fifteen and not more than twenty five percent of the depth if not more than two dielectric cladding layers have been deposited in the trench; and
    optionally repeating the plasma etching and additional dielectric layer depositing steps until the trench is filled, the step of optionally repeating the plasma etching step including
    removing at least thirty and not more than seventy percent of the additional layer thickness if not more than two dielectric layers have been deposited in the trench and removing at least fifteen and not more than twenty five percent of the thickness if at least two dielectric layers have been deposited in the trench.

* * * * *